US012769199B2

(12) United States Patent
Lee et al.

(10) Patent No.: US 12,769,199 B2
(45) Date of Patent: Oct. 20, 2026

(54) PHOTOMASK AND CORRECTING METHOD FOR EXPOSING APPARATUS USING PHOTOMASK

(71) Applicant: Samsung Display Co., LTD., Yongin-si (KR)

(72) Inventors: Yoon Yeol Lee, Yongin-si (KR); Jae Woo Lee, Seongnam-si (KR); Hyun-Woo Kim, Seoul (KR)

(73) Assignee: Samsung Display Co., Ltd., Yongin-Si (KR)

( * ) Notice: Subject to any disclaimer, the term of this patent is extended or adjusted under 35 U.S.C. 154(b) by 1048 days.

(21) Appl. No.: 17/888,729

(22) Filed: Aug. 16, 2022

(65) Prior Publication Data

US 2023/0105386 A1 Apr. 6, 2023

(30) Foreign Application Priority Data

Oct. 6, 2021 (KR) ........................ 10-2021-0132373

(51) Int. Cl.
*G03F 1/36* (2012.01)
*G03F 7/20* (2006.01)

(52) U.S. Cl.
CPC . *G03F 1/36* (2013.01); *G03F 7/20* (2013.01)

(58) Field of Classification Search
CPC ..................................... G03F 1/36; G03F 1/38
See application file for complete search history.

(56) References Cited

U.S. PATENT DOCUMENTS

2005/0074677 A1* 4/2005 Laidig ........................ G03F 1/36 430/5
2005/0195398 A1 9/2005 Adel et al.
2014/0093814 A1* 4/2014 Chen ......................... G03F 1/70 430/5
2016/0062226 A1* 3/2016 Lin ........................... G03F 1/36 430/5

FOREIGN PATENT DOCUMENTS

JP 2001-201844 7/2001
JP 2006-37148 2/2006
JP 2018-72690 5/2018
KR 10-2007-0058374 A 6/2007
KR 10-2017-0010263 1/2017

OTHER PUBLICATIONS

Richard A. Lawson et al., "Overview of materials and processes for lithography", Frontiers of Nanoscience, 2016, pp. 1-90, vol. 11.

* cited by examiner

*Primary Examiner* — Daborah Chacko-Davis
(74) *Attorney, Agent, or Firm* — Innovation Counsel LLP

(57) ABSTRACT

An exposure mask includes a pattern part exposed to light to form a pattern on a substrate, a surrounding part that surrounds a periphery of the pattern part, and correcting pattern parts disposed on the surrounding part. The correcting pattern parts are disposed in a line along an edge of the pattern part. A correcting method of an exposure apparatus includes correcting a light supply direction of a light supply unit based on a movement direction and a speed of the light supply unit, exposing light in the corrected light supply direction, forming exposure patterns by exposing light to correcting pattern parts, determining whether an error occurs in the light supply direction by using the exposure patterns, and correcting the light supply direction based on the determined error.

9 Claims, 13 Drawing Sheets

PHOTOMASK AND CORRECTING METHOD FOR EXPOSING APPARATUS USING PHOTOMASK

CROSS-REFERENCE TO RELATED APPLICATION(S)

This application claims priority to and the benefit of Korean Patent Application No. 10-2021-0132373 under 35 U.S.C. § 119, filed in the Korean Intellectual Property Office on Oct. 6, 2021, the entire contents of which are incorporated herein by reference.

BACKGROUND

1. Technical Field

The disclosure relates to an exposure mask and a correcting method of an exposure apparatus using the same.

2. Description of the Related Art

A photolithography process may be used to form a device including a display device.

When an error occurs in an exposure direction of the exposure apparatus during performing the photolithography process using an exposure apparatus and a photomask, an error may occur in a pattern formed through the photolithography process using the exposure apparatus.

The resolution of the display device increases and the size of the patterns included in the display device decreases, and accordingly, the need to further reduce the error on the exposure direction of the exposure apparatus is increasing.

The above information disclosed in this Background section is only for enhancement of understanding of the background of the described technology, and therefore it may contain information that does not form the prior art that is already known in this country to a person of ordinary skill in the art.

SUMMARY

Embodiments are to provide an exposure mask capable of reducing errors in the exposure direction of the exposure apparatus and a correcting method of the exposure apparatus using the same.

However, the problems to be solved by embodiments are not limited to the above-described problem, and may be variously extended in a range of technical ideas included in embodiments.

An exposure mask according to an embodiment may include a pattern part exposed to light to form a pattern on a substrate, a surrounding part that surrounds a periphery of the pattern part, and a plurality of correcting pattern parts disposed on the surrounding part. The plurality of correcting pattern parts may be disposed in a line along an edge of the pattern part.

Each of the plurality of correcting pattern parts may include a plurality of correcting patterns, and the plurality of correcting patterns may be disposed in a line along a first direction, and may be disposed in a line along a second direction perpendicular to the first direction.

Adjacent one of the plurality of correcting patterns disposed in the first direction may have a first pitch, and adjacent ones of the plurality of correcting patterns disposed in the second direction may have a second pitch.

The first pitch and the second pitch may be same as each other.

The first pitch and the second pitch may be about 20 μm.

The plurality of correcting patterns may have a same planar shape as each other.

The plurality of correcting patterns may have a same area as each other.

The plurality of correcting patterns may have a quadrangle shape.

The plurality of correcting pattern may have a cross shape.

The plurality of correcting patterns may have a quadrangle shape with an edge chamfered.

A correcting method of an exposure apparatus according to an embodiment may include correcting a light supply direction of a light supply unit based on a movement direction and a speed of the light supply unit of the exposure apparatus, exposing light in the primarily corrected light supply direction, forming a plurality of exposure patterns by exposing light to a plurality of correcting pattern parts, determining whether an error occurs in the light supply direction by using the exposure pattern, and correcting the light supply direction based on the determined error.

The exposing of the light may use an exposure mask. The exposure mask may include a pattern part exposed to light to form the exposure patterns on a substrate, a surrounding part that surrounds a periphery of the pattern part, and a plurality of correcting pattern parts disposed on the surrounding part. The plurality of correcting pattern parts may be disposed in a line along an edge of the pattern part.

The determining of whether the error occurs may include determining whether the plurality of exposure patterns are disposed in a line along the first direction or the second direction.

The determining of whether the error occurs may include measuring a distance at which the plurality of exposure patterns deviate along the first direction or the second direction.

According to the exposure mask and the correcting method of the exposure apparatus using the exposure mask according to embodiments, it may be possible to reduce the error in the exposure direction of the exposure apparatus.

It is apparent that the effect of the embodiments is not limited to the above-described effect, but may be variously extended within a range without departing from the spirit and scope of the embodiments.

DETAILED DESCRIPTION OF THE EMBODIMENTS

Figure 1:
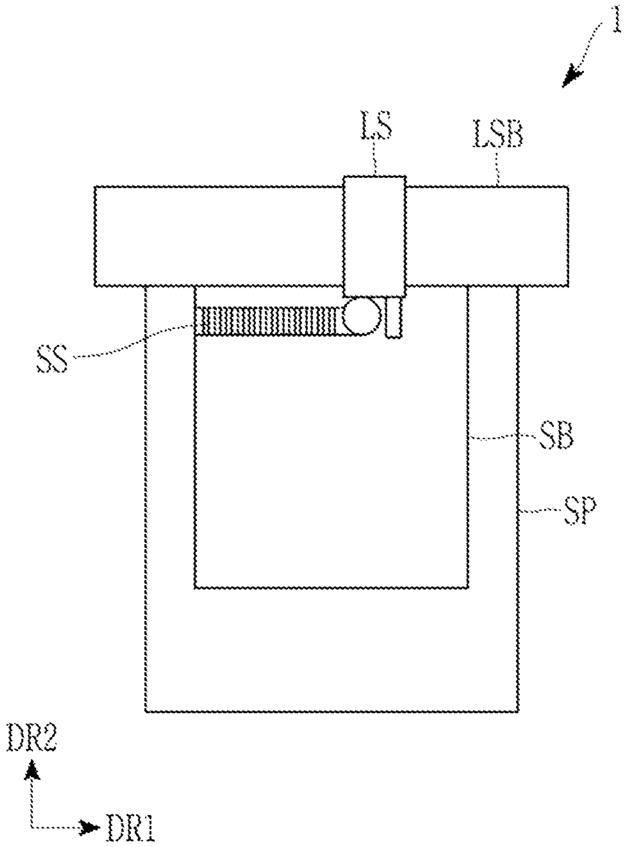
FIG. 1 is a plan view of an exposure apparatus according to an embodiment.

The embodiments will be described more fully hereinafter with reference to the accompanying drawings, in which embodiments of are shown. As those skilled in the art would realize, the described embodiments may be modified in various different ways, all without departing from the spirit or scope of the embodiment.

Descriptions of parts not related to the embodiment are omitted, and like reference numerals designate like elements throughout the specification.

The attached drawings are only for easy understanding of embodiments disclosed in the specification, and technical ideas disclosed in the specification are not limited by the attached drawings, and it should be understood to include all modifications, equivalents, or substitutes included in the ideas and technical ranges of the embodiment.

In the accompanying drawings, some constituent elements are exaggerated, omitted, or schematically illustrated, and the size of each constituent element does not entirely reflect the actual size. In the drawings, the thickness of layers, films, panels, regions, etc., are exaggerated for clarity. In the drawings, for better understanding and ease of description, the thicknesses of some layers and areas are exaggerated.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, the word "on" or "above" means positioned on or below the object portion, and does not necessarily mean positioned on the upper side of the object portion based on a gravitational direction.

Unless explicitly described to the contrary, the word "comprise", and variations such as "comprises" or "comprising", will be understood to imply the inclusion of stated elements but not the exclusion of any other elements.

Throughout the specification, the phrase "on a plane" means viewing the object portion from the top, and the phrase "on a cross-section" means viewing a cross-section of which the object portion is vertically cut from the side.

In the specification, when referring to "connected to", this does not mean only that two or more constituent elements are directly connected to each other, but the two or more constituent elements may be indirectly connected and physically connected through other constituent elements, and they may also be electrically connected or referred to by different names depending on the position or function, and may mean that they are one body.

Hereinafter, various embodiments and variations will be described in detail with reference to accompanying drawings.

First, an exposure apparatus 1 according to an embodiment is described with reference to FIG. 1. FIG. 1 is a plan view of an exposure apparatus according to an embodiment.

Referring to FIG. 1, an exposure apparatus 1 according to an embodiment may include a substrate supporting plate SP for supporting a substrate SB of a process target, a light supply unit LS that supplies exposure light such as a laser to a substrate SB installed on the substrate supporting plate SP, and a light source supporting unit LSB to which the light supply unit LS is installed and moves.

The light supply unit LS may supply light B such that the supplied light B may be diffused along a direction of scan-strips (SS), in a direction parallel to the second direction DR2 perpendicular to the first direction DR1 while moving along the first direction DR1 along the light source supporting unit LSB.

The light supply unit LS may supply light B to the entire surface of the substrate SB while repeating supplying light B on the substrate SB while moving along the direction parallel to the first direction DR1, moving in an opposite direction to the second direction DR2, and supplying light B on the substrate SB again while moving along the first direction DR1.

Figure 2:
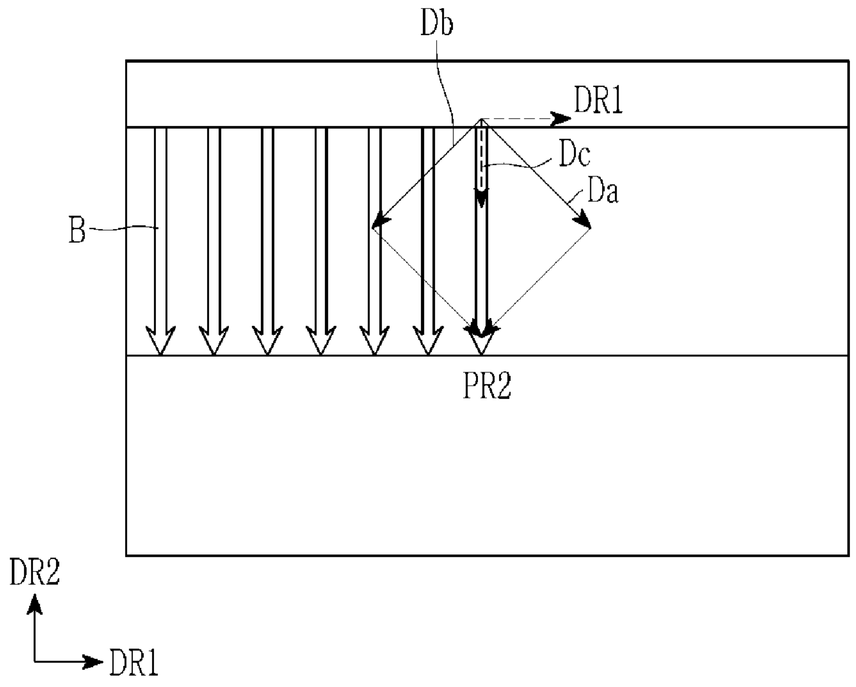
FIG. 2 is a plane view showing a part of FIG. 1 and a light supply direction.

The supply direction of light B supplied from exposure apparatus 1 is described with reference to FIG. 2 along with FIG. 1. FIG. 2 is a plane view showing a part and a light supply direction of FIG. 1.

Referring to FIG. 1 and FIG. 2, the light supply unit LS may supply light B while moving along the light source supporting unit LSB in the first direction DR1. Light B must be supplied along a target direction Dc parallel to the second direction DR2.

As described above, since the light supply unit LS may move in the direction parallel to the first direction DR1, if light is supplied from the light supply unit LS in the direction parallel to the second direction DR2 through the scan-strips (SS), light may be actually supplied along a third direction Da, which is a vector sum of the first direction DR1, which is the movement direction of the light supply unit LS, and the direction in which light is supplied.

Therefore, in order for light to be supplied in the target direction Dc parallel to the second direction DR2, the direction of the vector sum of the third direction Da and the fourth direction Db should be corrected to be parallel to the target direction Dc by correcting the light supply direction to the fourth direction Db.

In this way, by correcting the direction in which light is actually supplied to the fourth direction Db, even if the light supply unit LS moves in the direction parallel to the first direction DR1, light B that is actually supplied may be supplied in the target direction Dc.

If some error occurs in the fourth direction Db, which is the supply direction of corrected light, an error may also occur in the position of the pattern formed on the substrate SB, and in consideration of this, by additionally correcting the fourth direction Db, which is the corrected light level direction, the accuracy of the supply direction of light B supplied from the light supply unit LS of the exposure apparatus 1 may be increased.

Figure 3:
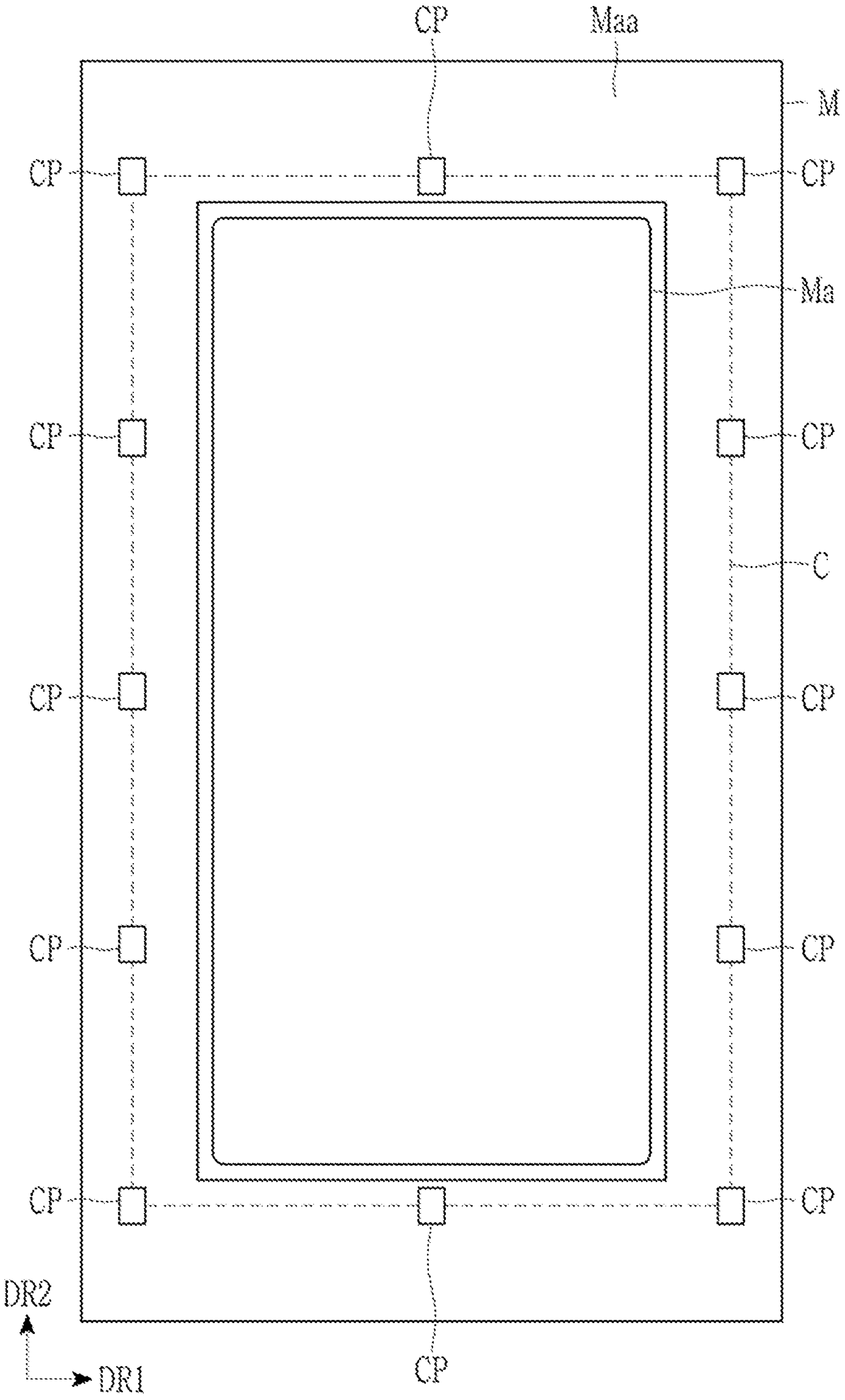
FIG. 3 is a plan view briefly showing an exposure mask according to an embodiment.

The exposure mask according to an embodiment is described with reference to FIG. 3. FIG. 3 is a top view schematically showing an exposure mask according to an embodiment.

Referring to FIG. 3, an exposure mask M according to an embodiment may include a pattern part Ma exposed to form a desired pattern on a substrate SB, and a surrounding part Maa that is disposed to surround the periphery of the pattern part Ma.

The exposure mask M may include multiple correcting pattern parts CP formed on the surrounding part Maa of the exposure mask M.

At least three correcting pattern parts CP may be disposed along each edge parallel to the first direction DR1 or parallel to the second direction DR2 of the pattern part Ma of the exposure mask M, and imaginary line C connecting the multiple correcting pattern part CP may be disposed to surround the pattern part Ma of the exposure mask M.

As the at least three correcting pattern part CP is disposed along each edge parallel to the first direction DR1 or parallel to the second direction DR2 of the pattern part Ma of the exposure mask M, even if the size of the exposure mask M increases, an error in the exposure direction error may be determined at the middle part as well as both ends facing each other along the first direction DR1 and the second direction DR2 of the exposure mask M.

Figure 4:
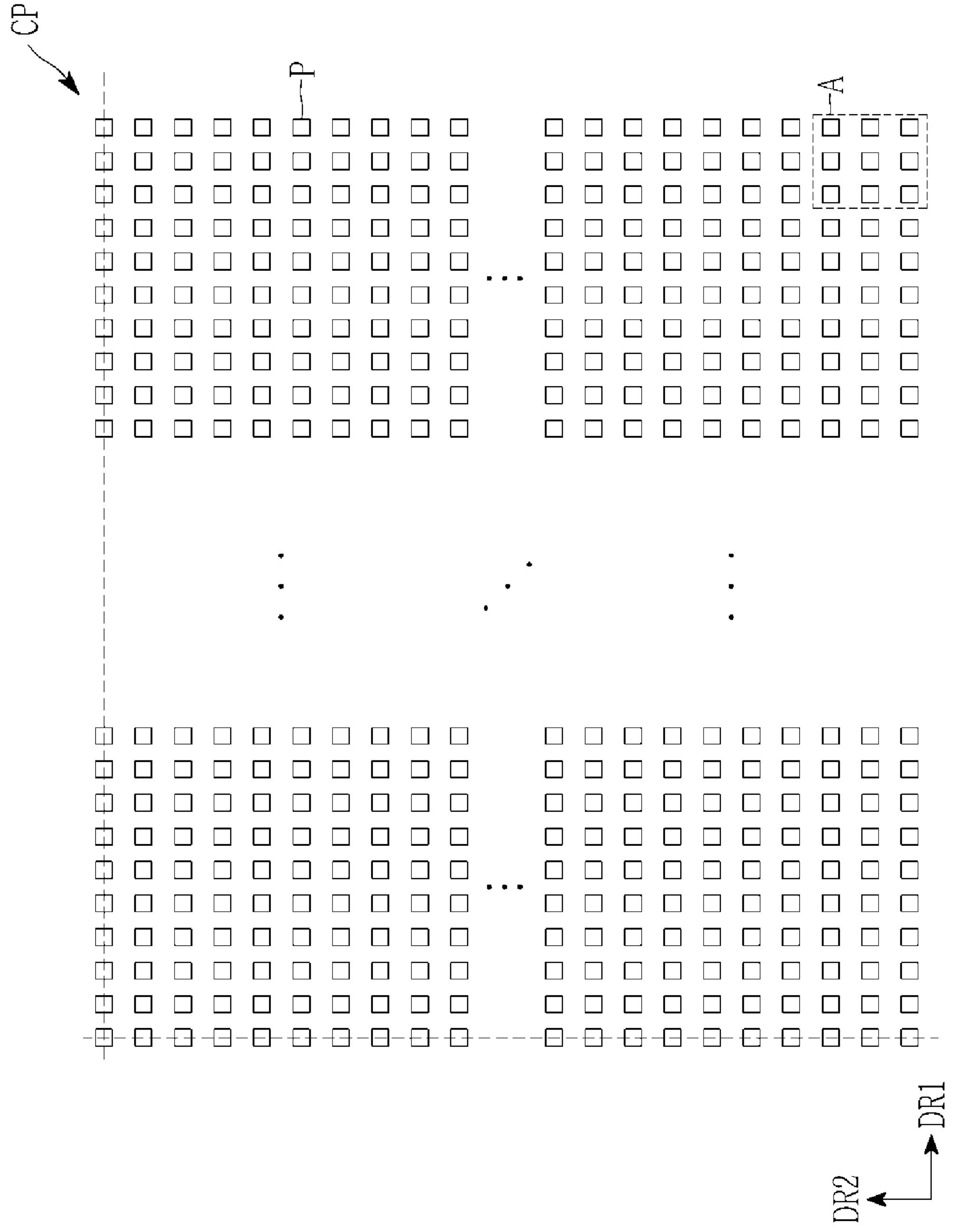
FIG. 4 is a layout view of a correcting pattern part of an exposure mask according to an embodiment.

The correcting pattern part CP of the exposure mask M according to an embodiment is described with reference to FIG. 4 and FIG. 5. FIG. 4 is a layout view of a correcting pattern part of an exposure mask according to an embodiment, and FIG. 5 is an enlarged view of part A of FIG. 4.

Referring to FIG. 4, the correcting pattern part CP of the exposure mask M according to an embodiment may include multiple correcting patterns P disposed in a line in the direction parallel to the first direction DR1 and the multiple correcting patterns P disposed in a line in the direction parallel to the second direction DR2.

As shown in FIG. 4, a line connecting the center of the multiple correcting patterns P of the correcting pattern part CP disposed along the first direction DR1 may extend in parallel to the first direction DR1, and a line connecting the center of the multiple correcting patterns P of the correcting pattern part CP may extend in parallel to the second direction DR2.

Figure 5:
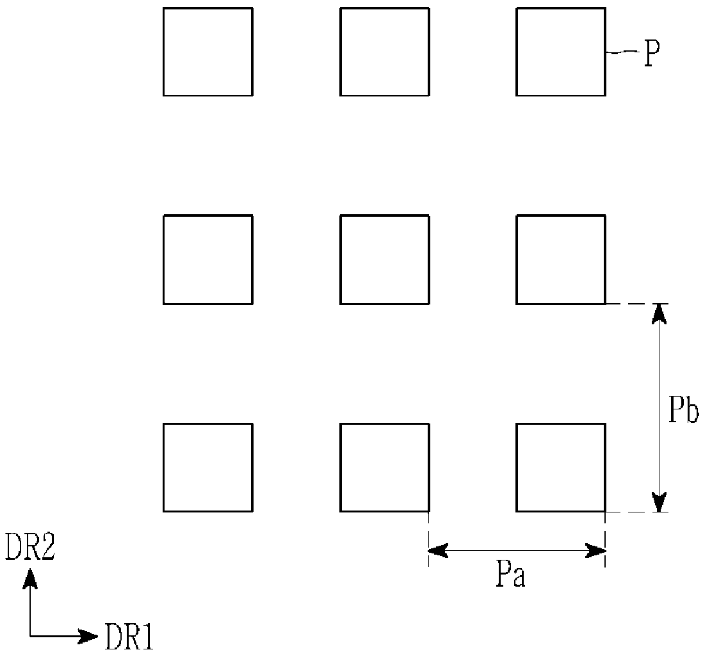
FIG. 5 is an enlarged view of part A of FIG. 4.

Referring to FIG. 5, the multiple correcting patterns P of the correcting pattern part CP of the exposure mask M may be spaced apart so as to have a first pitch Pa along the first direction DR1 and a second pitch Pb along the second direction DR2. The first pitch Pa and the second pitch Pb may be approximately the same. For example, the first pitch Pa and the second pitch Pb may be about 20 μm.

As shown in FIG. 4 and FIG. 5, the correcting pattern part CP of the exposure mask M according to an embodiment may include the multiple correcting patterns P, and the multiple correcting patterns P may be disposed in a line so as to have a distance with the first pitch Pa in the direction parallel to the first direction DR1, and simultaneously disposed in a line so as to have a distance with the second pitch Pb in the direction parallel to the second direction DR2.

The multiple correcting patterns P of the correcting pattern part CP of the exposure mask M according to an embodiment may have the same area and the same planar shape, and for example, may have a substantially quadrangle planar shape.

Figure 6:
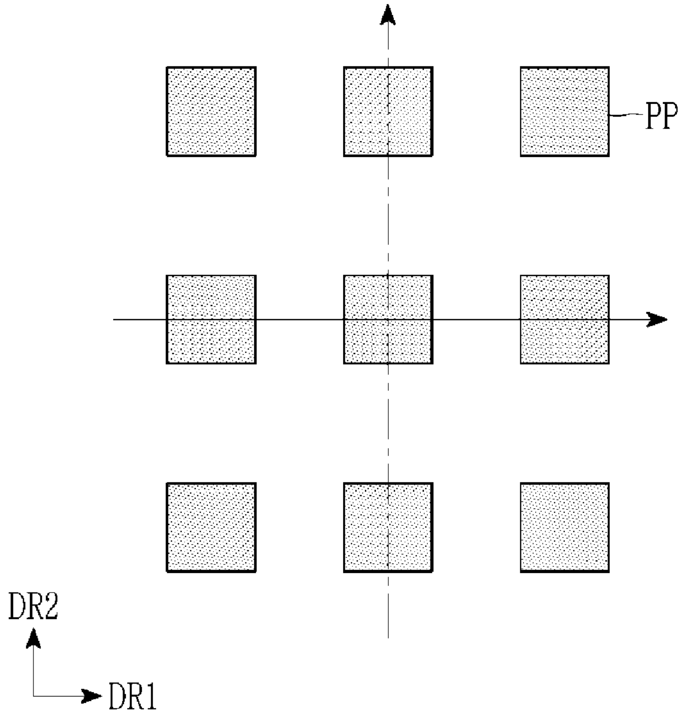
FIG. 6 to FIG. 8 are layout views of an exposure pattern formed by an exposure mask according to an embodiment.
Figure 7:
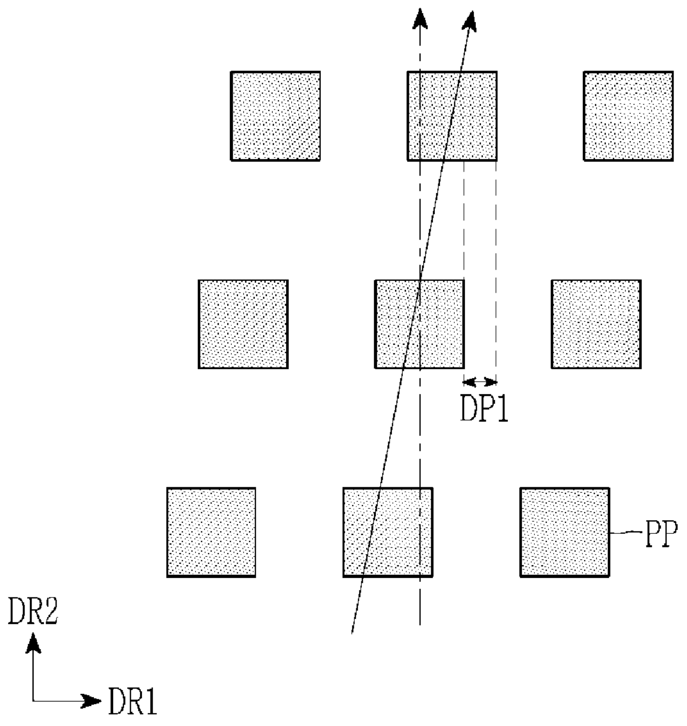
Figure 8:
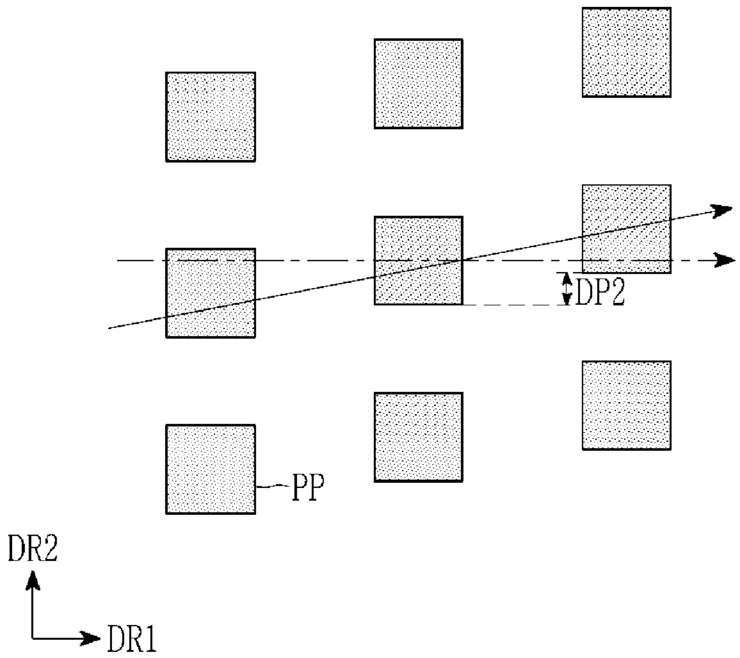

The exposure pattern using the multiple correcting patterns P of the exposure mask M according to an embodiment is described with reference to FIG. 6 to FIG. 8. FIG. 6 to FIG. 8 are layout views of an exposure pattern formed by an exposure mask according to an embodiment.

First, the case in which there is no error in the exposure direction of light B exposed from the exposure apparatus 1 is described with reference to FIG. 6.

Referring to FIG. 6, if there is no error in the exposure direction of light B exposed from the exposure apparatus 1, the exposure pattern PP formed on the substrate SB may be disposed in a line to have a constant distance along the direction parallel to the first direction DR1 and the second direction DR2, like the multiple correcting patterns P.

Referring to FIG. 7 and FIG. 8, if an error occurs in the exposure direction of light B exposed from the exposure apparatus 1, the exposure pattern PP formed on the substrate SB may not be disposed in a line along the second direction DR2, but may be disposed to be shifted by a first distance DP1 along the second direction DR2 and to be shifted by a second distance DP2 along the first direction DR1.

It may be determined whether there is the error in the exposure direction of light B exposed from the exposure apparatus 1 depending on whether the exposure pattern PP formed on the substrate SB by the multiple correcting patterns P of the correcting pattern part CP of the exposure mask M is formed to be disposed in a line along the first direction DR1 and the second direction DR2 or to be shifted from each other.

Also, by measuring the second distance DP2 and the first distance DP1 in which the exposure pattern PP is shifted along the first direction DR1 and the second direction DR2, the error direction and the error size may be determined in the exposure direction of light B exposed from the exposure apparatus 1. In consideration of the error direction and the error size of the exposure direction determined as described above, the exposure direction of light B may be further corrected to increase the accuracy of the exposure direction of the exposure apparatus 1.

As described above, the first pitch Pa and the second pitch Pb may be about 20 μm, and the first distance DP1 and the second distance DP2 may be less than about 20 μm. For example, the first distance DP1 and the second distance DP2 may be about 60 nm to about 100 nm. The error range of the exposure direction of light B exposed from the exposure apparatus 1 that may be measured using the exposure pattern PP may be smaller than the first pitch Pa and the second pitch Pb, which are the distances between two adjacent correcting patterns P among the multiple correcting patterns P of the correcting pattern part CP of the exposure mask M.

Figure 9:
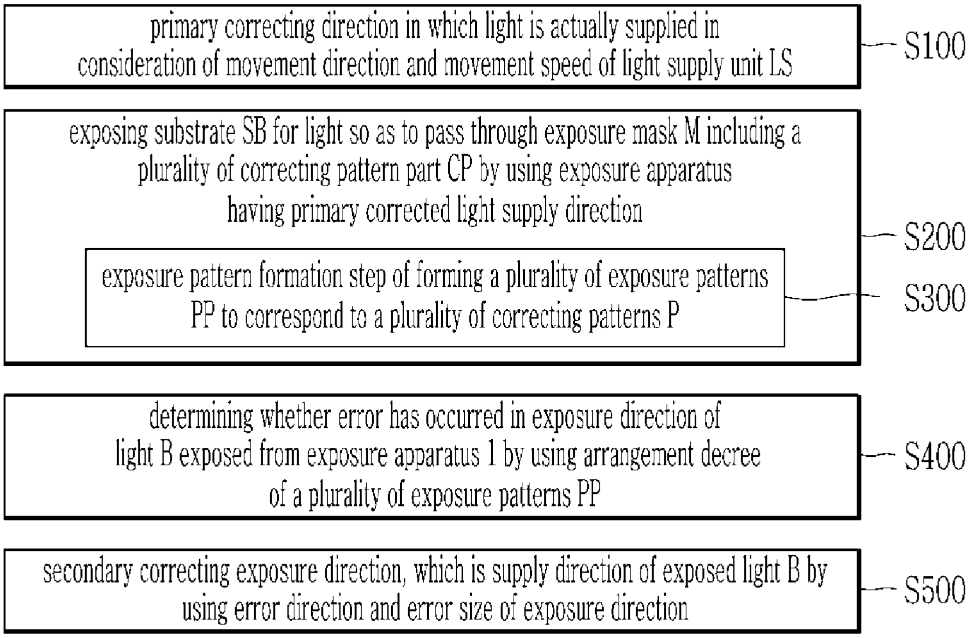
FIG. 9 is a flowchart of a correcting method of an exposure apparatus according to an embodiment.

A correcting method of the exposure apparatus using the exposure mask according to an embodiment is described with reference to FIG. 9 along with FIG. 1 to FIG. 8. FIG. 9 is a flowchart of a correcting method of an exposure apparatus according to an embodiment.

First, the correcting method of the exposure apparatus using the exposure mask according to an embodiment may include a primary correcting step (S100) of primarily correcting the direction in which light B is actually supplied in the fourth direction Db in consideration of the movement direction and the movement speed of the light supply unit LS during the light supply unit LS supplies light B while moving in the direction parallel to the first direction DR1, and even if the light supply unit LS moves in the direction parallel to the first direction DR1, light B may be actually supplied in the target direction Dc.

Second, the correcting method of the exposure apparatus using the exposure mask according to an embodiment may include an exposure step (S200) of exposing the substrate SB to light B so as to pass through the exposure mask M including the multiple correcting pattern parts CP by using the exposure apparatus 1 having the primarily corrected light supply direction in the primary correcting step (S100).

The exposure step (S200) of the correcting method of the exposure apparatus using the exposure mask according to an embodiment may include an exposure pattern formation step (S300) of forming multiple exposure patterns PP to correspond to the multiple correcting patterns P by the correcting pattern parts CP.

Third, the correcting method of the exposure apparatus using the exposure mask M according to an embodiment, as described with reference to FIG. 6 to FIG. 8, may include an error determination step (S400) of determining whether an error has occurred in the exposure direction, which is the supply direction of light B exposed from the exposure apparatus 1, by using the arrangement of the multiple exposure patterns PP formed in the exposure pattern formation step (S300).

At this step, in case that an error occurred in the exposure direction, it is possible to determine the error size as well as the error direction of the exposure direction of the exposed light B.

In case that light B is exposed, whether the error occurred in the exposure direction may be determined by checking whether the multiple exposure patterns PP are disposed in a line along the first direction DR1 and the second direction DR2. For example, in case that the multiple exposure patterns PP are disposed in a line along the first direction DR1 and the second direction DR2, it may be determined that the error did not occur in the exposure direction of exposed light B. In case that the multiple exposure patterns PP are disposed to be misaligned without being disposed in a line along the first direction DR1 and the second direction DR2, it may be determined that the error has occurred in the exposure direction of light B.

In case that light B is exposed, the error size generated in the exposure direction may be determined by measuring the second distance DP2 and the first distance DP1 in which the multiple of exposure patterns PP are displaced from each other along the first direction DR1 and the second direction DR2.

Fourth, the correcting method of the exposure apparatus 1 using the exposure mask M according to an embodiment may include a secondary correcting step (S500) of secondarily correcting the exposure direction, which is the supply direction of light B, by using the error direction and the error size of the exposure direction determined in the error determination step (S400).

As described above, the correcting method of the exposure apparatus 1 using the exposure mask M according to an embodiment may use the multiple correcting pattern parts CP formed in the surrounding part Maa of the exposure mask M to determine whether the error occurred in the exposure direction of light B, the error direction, and the error size, and additionally to correct the exposure direction of the exposure apparatus 1 by using these, thereby increasing the accuracy of the exposure process by reducing the error of the exposure direction of the exposure apparatus 1.

Figure 10:
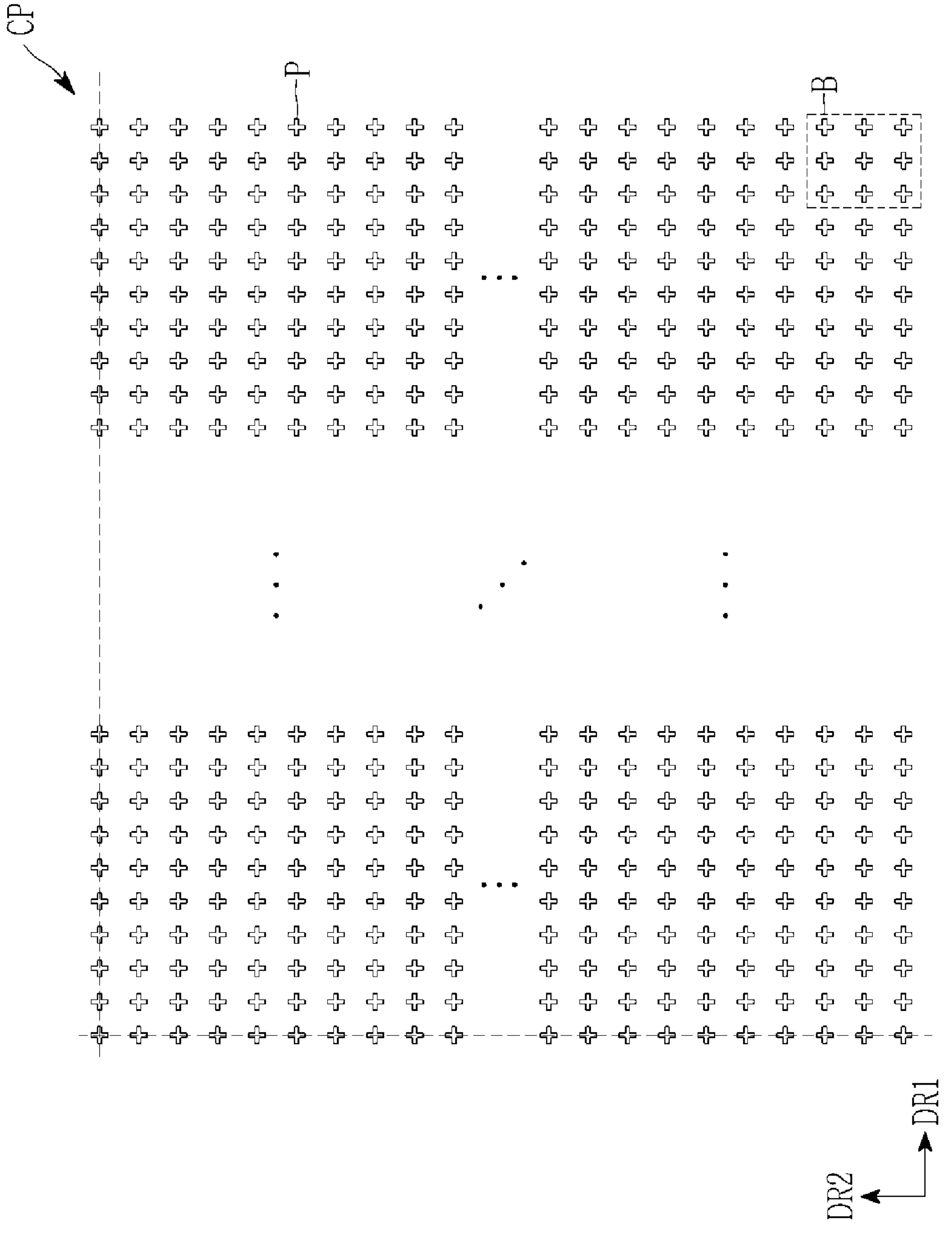
FIG. 10 is a layout view of a correcting pattern part of an exposure mask according to an embodiment.

The correcting pattern part CP of the exposure mask M according to an embodiment is described with reference to FIG. 10 and FIG. 11. FIG. 10 is a layout view of a correcting pattern part of an exposure mask according to an embodiment, and FIG. 11 is an enlarged view of part B of FIG. 10.

Figure 11:
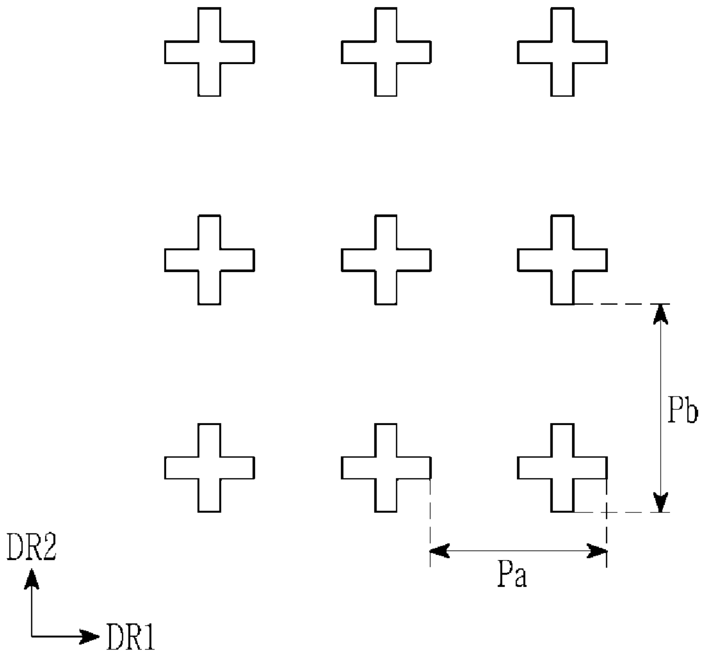
FIG. 11 is an enlarged view of part B of FIG. 10.

Referring to FIG. 10 and FIG. 11, the correcting pattern part CP of the exposure mask M according to the embodiment may be similar to the correcting pattern part CP of the exposure mask M according to the embodiment described with reference to FIG. 4 and FIG. 5.

The correcting pattern part CP of the exposure mask M according to the embodiment may include the multiple correcting patterns P, and the multiple correcting patterns P may be disposed in a line so as to have a distance with the first pitch Pa in the direction parallel to the first direction DR1 and simultaneously disposed in a line so as to have a distance with the second pitch Pb in the direction parallel to the second direction DR2. For example, the first pitch Pa and the second pitch Pb may be about 20 μm.

The multiple correcting patterns P may have the same area and the same planar shape.

However, the multiple correcting patterns P of the correcting pattern part CP of the exposure mask M according to the embodiment may have an almost cross-shaped planar shape unlike the multiple correcting patterns P of the correcting pattern part CP of the exposure mask M according to the embodiment shown in FIG. 4 and FIG. 5.

The method of determining the error direction and error size of the correcting pattern part CP of the exposure mask M and the exposure direction using the same according to the embodiment described above may be all applicable to the correcting pattern part CP of the exposure mask M according to the embodiment in FIG. 10 and FIG. 11.

Figure 12:
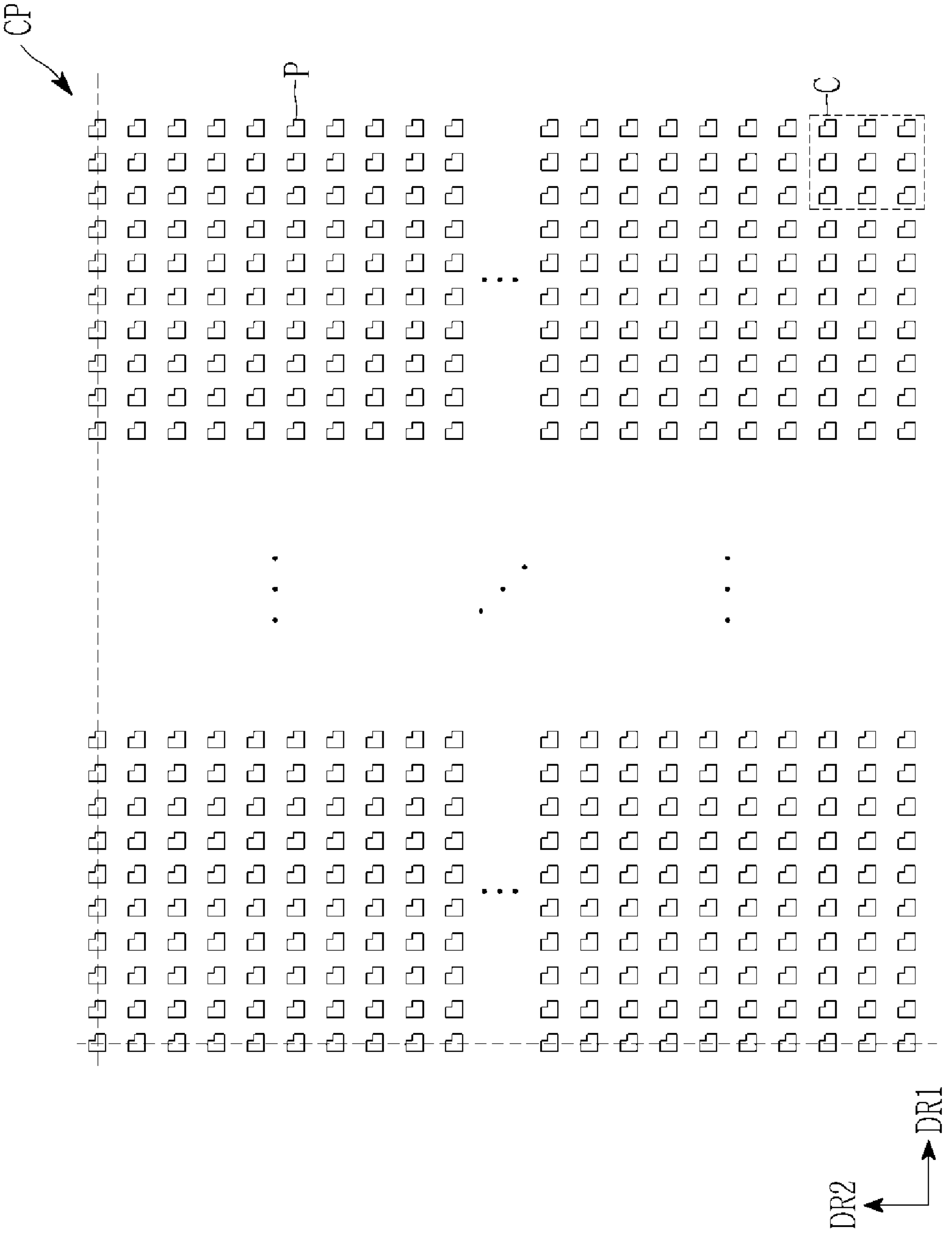
FIG. 12 is a layout view of a correcting pattern part of an exposure mask according to an embodiment.

The correcting pattern part CP of the exposure mask M according to an embodiment is described with reference to FIG. 12 and FIG. 13. FIG. 12 is a layout view of a correcting pattern part of an exposure mask according to another embodiment, and FIG. 13 is an enlarged view of part C of FIG. 12.

Figure 13:
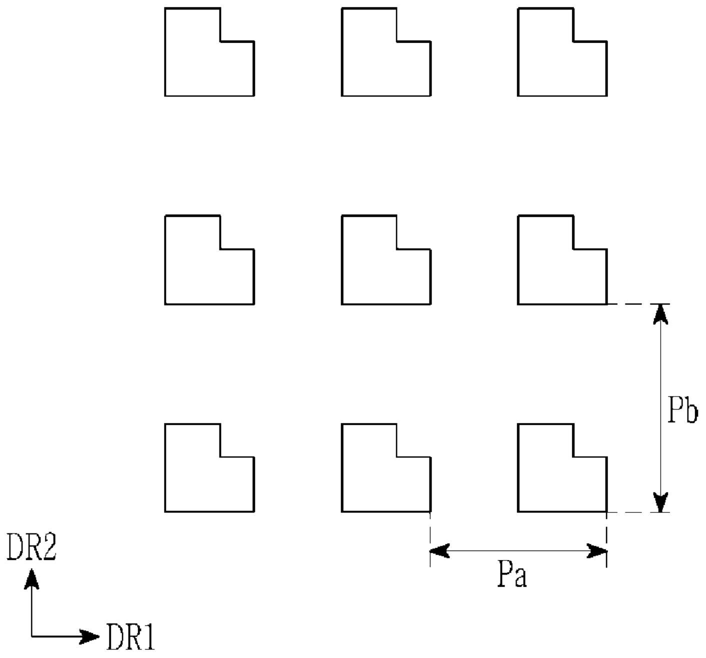
FIG. 13 is an enlarged view of part C of FIG. 12.

Referring to FIG. 12 and FIG. 13, the correcting pattern part CP of the exposure mask M according to the embodiment may be similar to the correcting pattern part CP of the exposure mask M according to the embodiment described with reference to FIG. 4 and FIG. 5.

The correcting pattern part CP of the exposure mask M according to the embodiment may include the multiple correcting patterns P, and the multiple correcting patterns P may be disposed in a line so as to have a distance with the first pitch Pa in the direction parallel to the first direction DR1 and simultaneously disposed in a line so as to have a distance with the second pitch Pb in the direction parallel to the second direction DR2.

The multiple correcting patterns P may have the same area and the same planar shape.

However, the multiple correcting patterns P of the correcting pattern part CP of the exposure mask M according to the embodiment, unlike the multiple correcting patterns P of the correcting pattern part CP of the exposure mask M according to the embodiment shown in FIG. 4 and FIG. 5, may have a planar hexagonal shape in which one corner is a chamfered quadrangle.

The method of determining the error direction and error size of the correcting pattern part CP of the exposure mask M and the exposure direction using the same according to the embodiment described above may be all applicable to the correcting pattern part CP of the exposure mask M according to the embodiment in FIG. 12 and FIG. 13.

While this disclosure has been described in connection with what is considered to be practical embodiments, it is to be understood that the disclosure is not limited to the disclosed embodiments. On the contrary, it is intended to cover various modifications and equivalent arrangements included within the spirit and scope of the appended claims.

What is claimed is:

1. An exposure mask comprising:

a pattern part exposed to light to form a pattern on a substrate;

a surrounding part that surrounds a periphery of the pattern part; and a plurality of correcting pattern parts disposed on the surrounding part, wherein the plurality of correcting pattern parts are disposed in a line along an edge of the pattern part, and in use, the plurality of correcting pattern parts transmit light to form a plurality of exposure patterns on the substrate, wherein each of the plurality of correcting pattern parts includes a plurality of correcting patterns, and the plurality of correcting patterns are disposed in a line along a first direction, and are disposed in a line along a second direction perpendicular to the first direction.

2. The exposure mask of claim 1, wherein adjacent ones of the plurality of correcting patterns disposed in the first direction have a first pitch, and adjacent ones of the plurality of correcting patterns disposed in the second direction have a second pitch.

3. The exposure mask of claim 2, wherein the first pitch and the second pitch are same as each other.

4. The exposure mask of claim 3, wherein the first pitch and the second pitch are about 20 μm.

5. The exposure mask of claim 2, wherein the plurality of correcting patterns have a same planar shape as each other.

6. The exposure mask of claim 5, wherein the plurality of correcting patterns have a same area as each other.

7. The exposure mask of claim 5, wherein the plurality of correcting patterns have a quadrangle shape.

8. The exposure mask of claim 5, wherein the plurality of correcting patterns have a cross shape.

9. The exposure mask of claim 5, wherein the plurality of correcting patterns have a quadrangle shape with an edge chamfered.

* * * * *